(12) United States Patent
Abbott (10) Patent No.: US 9,150,959 B2
(45) Date of Patent: Oct. 6, 2015

(54) VAPOR DEPOSITION OF ANTI-STICTION LAYER FOR MICROMECHANICAL DEVICES

(76) Inventor: Kenneth A. Abbott, Garland, TX (US)

( * ) Notice: Subject to any disclaimer, the term of this patent is extended or adjusted under 35 U.S.C. 154(b) by 836 days.

(21) Appl. No.: 13/089,596

(22) Filed: Apr. 19, 2011

(65) Prior Publication Data

US 2012/0040095 A1 Feb. 16, 2012

Related U.S. Application Data

(63) Continuation of application No. 11/136,922, filed on May 25, 2005, now Pat. No. 7,927,423.

(51) Int. Cl.
| | |
|---|---|
| *C23C 14/56* | (2006.01) |
| *C23C 14/24* | (2006.01) |
| *C23C 16/44* | (2006.01) |
| *C23C 16/455* | (2006.01) |
| *B81B 3/00* | (2006.01) |
| *B05D 1/00* | (2006.01) |
| *B05D 1/18* | (2006.01) |
| *B03C 3/017* | (2006.01) |

(52) U.S. Cl.
CPC ............... *C23C 14/564* (2013.01); *B03C 3/017* (2013.01); *B05D 1/60* (2013.01); *B81B 3/0005* (2013.01); *C23C 14/24* (2013.01); *B05D 1/185* (2013.01); *B81B 2201/042* (2013.01); *B81C 2201/112* (2013.01); *C23C 16/4402* (2013.01); *C23C 16/45568* (2013.01); *C23C 16/45578* (2013.01)

(58) Field of Classification Search
CPC .. C23C 14/564; C23C 14/24; C23C 16/4402; C23C 16/45568; C23C 16/45578; B81B 3/0005; B81B 2201/042; B05D 1/60; B05D 1/185; B03C 3/017; B81C 2201/112
USPC .......................... 118/715; 156/345.29, 345.33
See application file for complete search history.

(56) References Cited

U.S. PATENT DOCUMENTS

| | | | |
|---|---|---|---|
| 3,933,652 A | 1/1976 | Weichselbaum et al. | |
| 4,775,398 A * | 10/1988 | Howeth | 55/302 |
| 4,960,448 A * | 10/1990 | Zievers | 55/523 |
| 5,013,384 A | 5/1991 | Mellink et al. | |
| 5,331,454 A | 7/1994 | Hornbeck | |
| 5,390,701 A * | 2/1995 | Lessley et al. | 137/549 |
| 5,474,585 A * | 12/1995 | Geibel et al. | 55/302 |
| 5,535,047 A | 7/1996 | Hornbeck | |
| 5,759,923 A * | 6/1998 | McMillan et al. | 438/788 |
| 5,908,662 A * | 6/1999 | Fu | 427/248.1 |
| 6,098,964 A | 8/2000 | Schmitt | |
| 6,491,518 B1 * | 12/2002 | Fujikawa et al. | 432/241 |
| 6,712,081 B1 * | 3/2004 | Uehara et al. | 134/105 |
| 7,927,423 B1 | 4/2011 | Abbott | |
| 2005/0098108 A1 * | 5/2005 | Sandhu | 118/715 |
| 2007/0266944 A1 | 11/2007 | Iizuka et al. | |
| 2012/0040095 A1 * | 2/2012 | Abbott | 427/248.1 |

FOREIGN PATENT DOCUMENTS

WO    WO 2004100249    11/2004

* cited by examiner

*Primary Examiner* — Jeffrie R Lund (74) *Attorney, Agent, or Firm* — Scott T. Griggs; Griggs Bergen LLP (57) ABSTRACT

A vapor deposition system includes a filter-diffuser device connected to a vapor inlet within a vacuum chamber for simultaneously filtering inflowing vapor to remove particulate matter while injecting vapor containing perfluordecanoic acid (PFDA) into the chamber through radially arranged porous metal filters to enable the deposition of a uniform monolayer of PFDA molecules onto the surfaces of a micromechanical device, such as a digital micromirror device.

21 Claims, 8 Drawing Sheets

VAPOR DEPOSITION OF ANTI-STICTION LAYER FOR MICROMECHANICAL DEVICES

PRIORITY STATEMENT & CROSS-REFERENCE TO RELATED APPLICATIONS

This application is a continuation of co-pending U.S. patent application Ser. No. 11/136,922, entitled "Vapor Deposition of Anti-Stiction Layer for Micromechanical Devices" filed on May 25, 2005, and issued on Apr. 19, 2011 as U.S. Pat. No. 7,927,423, in the name of Kenneth A. Abbott; which is hereby incorporated by reference for all purposes.

BACKGROUND OF THE INVENTION

The present invention relates generally to vapor deposition equipment and methods for depositing thin films, and more particularly to equipment and methods for vapor deposition of ultra-thin passivation layers on the surfaces of micromechanical devices.

In 1987, Larry J. Hornbeck, a scientist with Texas Instruments Incorporated (TI), invented a remarkable micromechanical device, which he initially called a deformable mirror device, but today is called a digital micromirror device or simply a DMD. The DMD is fabricated on a semiconductor chip and includes an array of hinge-mounted microscopic mirrors, each overlying an addressable memory cell whose binary state determines the ON or OFF position of its micromirror. The DMD chip is the basis for various imaging systems, including TI's amazing Digital Light Processing technology, which is used in digital home TV systems and motion picture projectors for movie theaters.

Figure 1A:
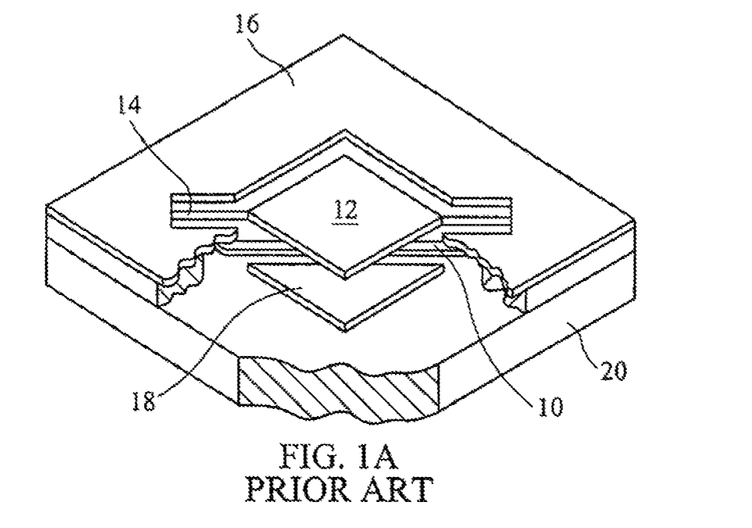
FIGS. 1a and 1b are schematic prospective views of a prior art micromirror structure with the micro mirror in an undeflected position and a deflected position.
Figure 1B:
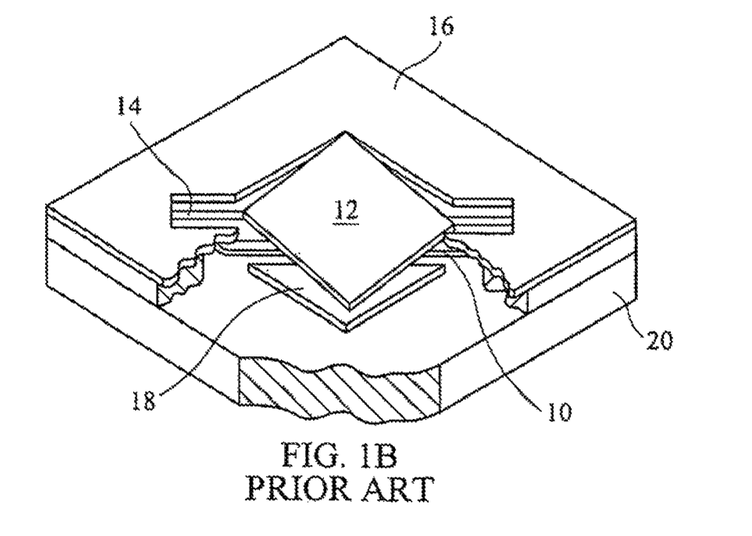

An early generation hinge-mounted DMD is described in Hornbeck U.S. Pat. No. 5,331,454, which discloses a solution to a sticking problem in which a special passivation layer is deposited on the metal surfaces of the DMD elements that repeatedly contact each other. The Hornbeck '454 patent is hereby incorporated by reference. FIGS. 1a and 1b of the Hornbeck '454 patent, which are reproduced herein with the same figure designations and reference numerals, show one micromirror 12 of a DMD chip in which the micromirror (referred to as a deflection element) is positioned first in its undeflected position (FIG. 1a) and then in its deflected position (FIG. 1b) under the electrostatic influence of an underlying address electrode 10. The micromirror 12 rotates on a hinge 14, which is secured in a support layer 16 disposed above a substrate 20. In the deflected position depicted in FIG. 1b, a corner of the micromirror 12 comes into contact with a landing electrode 18, which stops the micromirror's rotation at a precise angle of deflection from its undeflected position. The micromirror and electrodes of the device consist essentially of aluminum.

Attractive inter-molecular forces, known as Van der Waals forces, tend to cause the contacting surfaces to stick together. These forces gradually increase as the repeated contacting action causes the area of the contacting surfaces to gradually increase. Eventually, the Van der Waals forces exceed the restorative forces, leaving the micromirror 12 stuck in its deflected position. When this occurs, image quality is degraded, requiring replacement of the DMD chip in the imaging system. The term "stiction," which is short for "static friction," generally is used to refer to this sticking phenomenon.

Figure 3A:
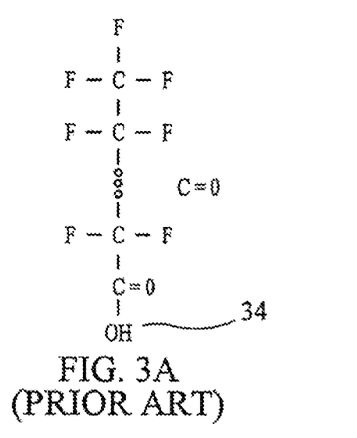
FIG. 3a shows the molecular structure of a perfluordecanoic acid (PFDA) molecule.
Figure 3B:
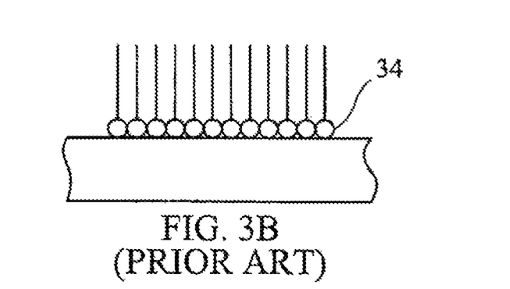
FIG. 3b schematically illustrates a monolayer of PFDA molecules bonded to a substrate.
Figure 3C:
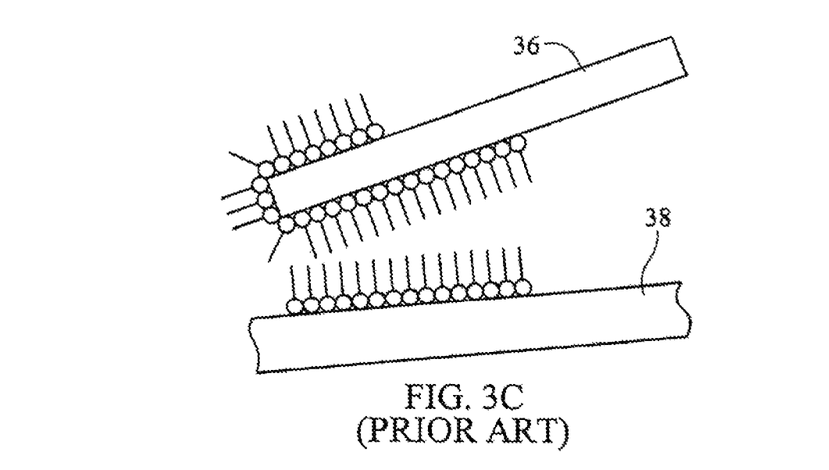
FIG. 3c schematically illustrates a first monolayer of PFDA molecules on the tip of a micromirror and a second monolayer of PFDA molecules on the surface of an underlying electrode, the molecules being shown greatly exaggerated in relative size.

The Hornbeck '454 patent explains how the deposition of a passivation layer on the surfaces of the micromirror and the landing electrode helps to prevent the build up of Van der Waals forces and the resulting sticking problem. The preferred passivant for the passivation layer is perfluordecanoic acid (PFDA). FIGS. 3a, 3b, and 3c of the Hornbeck '454 patent are also reproduced herein. FIG. 3a shows the molecular structure of a molecule of PFDA, which is a long-chain aliphatic halogenated polar compound having a COOH group at its polar end 34. Following a plasma surface-activation step, a PFDA deposition step deposits an ultra-thin "monolayer" of PFDA on the activated surfaces, typified schematically in FIG. 3b. The deposited single-molecule thick layer has each molecule oriented with the polar end 34 strongly bonded to the contacting surfaces of the micromirror 36 and the landing electrode 38, as depicted in FIG. 3c, in which the PFDA molecules are shown greatly exaggerated in relative size. The free end of each molecule terminates in a $CF_3$ group that is responsible for low Van der Waals surface forces. The deposited PFDA monolayer effectively eliminates performance-degrading stiction.

Hornbeck and TI gradually brought DMD technology from early generation prototypes to a commercial DMD chip by the mid-1990's. Hornbeck U.S. Pat. No. 5,535,047 describes a later generation DMD structure in which each micromirror is elevated above a supporting yoke. The yoke is hinge-mounted and includes landing tips that contact landing sites of a stationary electrode when the yoke is rotated to a fully deflected position. TI's present commercial DMD chips use such elevated-mirror, hinged-yoke architecture with each micromirror representing one pixel in a very large array of pixels. The Hornbeck '047 patent is hereby incorporated by reference.

Figure 2:
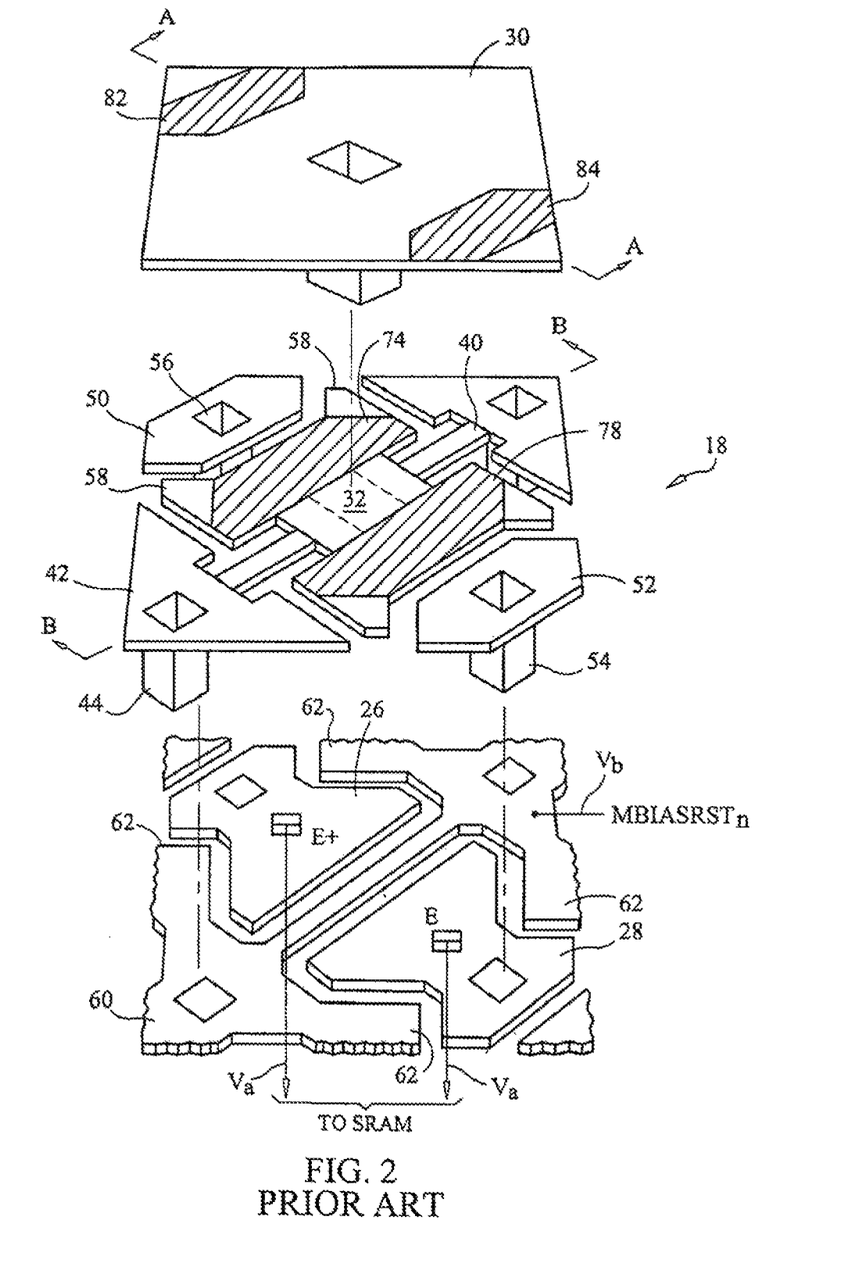
FIG. 2 is an exploded perspective view of one DMD pixel of a prior art array of such pixels showing the three-level structure of the pixel.
Figure 6:
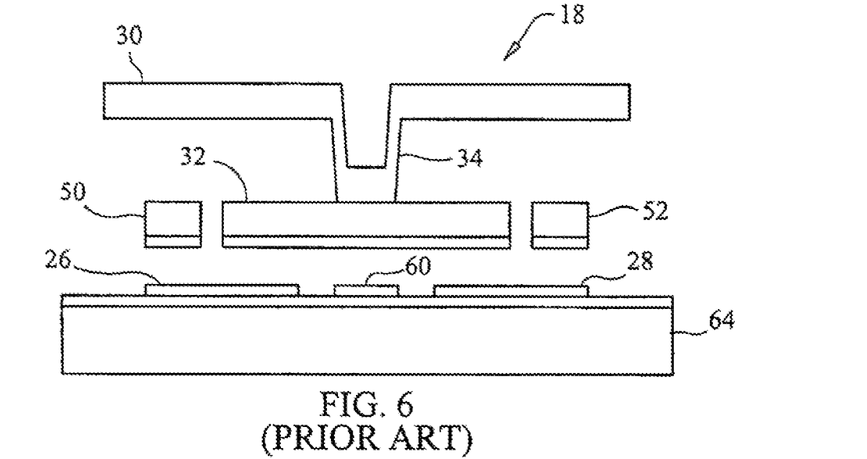
FIGS. 6 and 7 are cross-sectional views of the prior art pixel of FIG. 2 showing the micromirror in an undeflected position and a deflected position.
Figure 7:
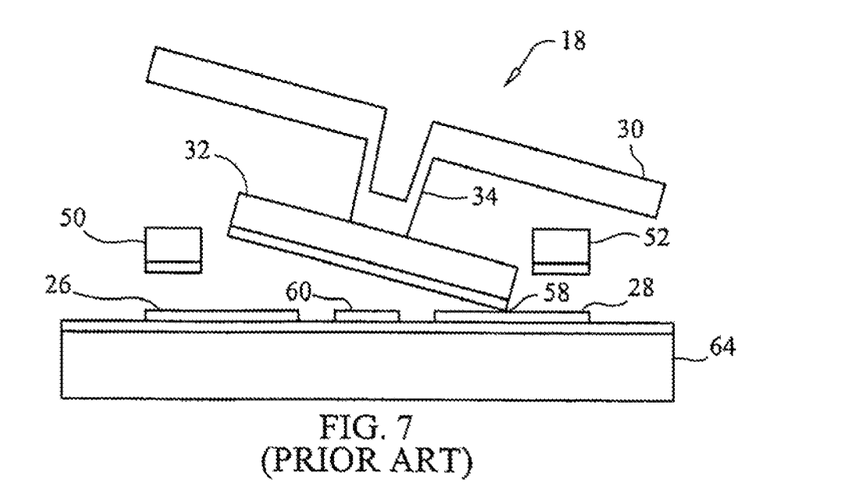

FIGS. 2, 6 and 7 of the Hornbeck '047 patent, which are reproduced herein, illustrate one pixel 18 in an exploded perspective view (FIG. 2), and in schematic cross-sections in an undeflected position (FIG. 6) and a deflected position (FIG. 7). The pixel 18 is multi-level structure constructed above a substrate 64 that includes addressable memory cells, such as conventional SRAM cells (not shown), which change their binary states to determine the changing positions of each associated micromirror 30. Each mirror 30 is supported by a post 34 that is mounted on a yoke 32. The yoke 32 rotates on a pair of torsion hinges 40 (FIG. 2). The other end of each hinge 40 is attached to a cap 42, which is supported by a post 44. The position of the yoke 32, and thus also the mirror 30, is determined by voltages applied to address electrodes 26 and 28 and a reset/bias bus 60 on the bottom level, and to address electrodes 50 and 52 supported at the intermediate level by posts 54 and 56. The yoke 32 is shown with cross-hatched portions 74 and 78 in FIG. 2 that are attracted to the respective underlying address electrodes 26 and 28. Similarly, the cross-hatched portions 82 and 84 of the mirror 30 are attracted to the respective underlying address electrodes 50 and 52. The reset/bias bus 60 has extensions that define landing sites 62. The yoke 32 has landing tips 58 that contact respective landing sites 62 when the yoke is deflected to either one of two deflected positions. The contacting action between respective landing tips 58 and landing sites 62 can give rise to stiction forces, which are lessened by the deposition of a PFDA anti-stiction layer.

The Hornbeck '454 patent describes methods for depositing a PFDA monolayer on the aluminum contacting surfaces of the device. For example, a solid source of PFDA is heated to its melting temperature to produce a vapor, which then forms the PFDA monolayer on the exposed aluminum surfaces of the device.

Figure 4:
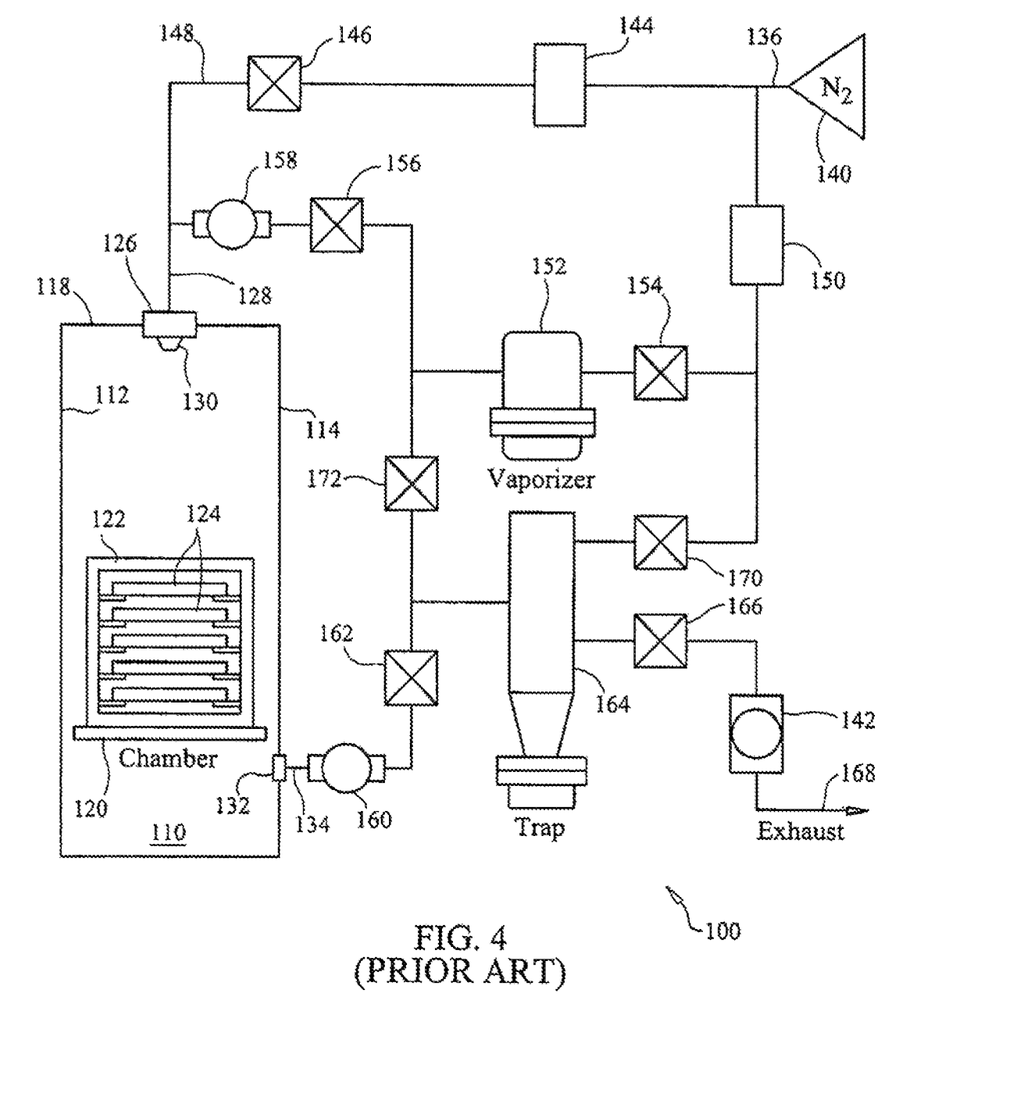
FIG. 4 is a diagram showing the interconnected components of a prior art vapor deposition system.

FIG. 4 schematically illustrates a prior art system 100 for depositing PFDA on DMD chips. The system includes a deposition chamber 110, which is a box-like configuration having vertical sidewalls 112 and 114, a bottom wall 116, and a ceiling wall 118 that define a sealed enclosure. A base plate 120, which is suspended by the sidewalls, serves as a support for a shelved cassette 122. The cassette 122 holds multiple wafers 124 that contain DMD chips. It will be appreciated by those skilled in the semiconductor art that such wafers each have a large number of chips that are later separated from the wafer and packaged as individual DMD chips. Although FIG. 4 shows only five wafers 124 held in a stacked arrangement in the cassette 122, it will also be appreciated that a typical cassette can carry many more wafers in practice. The cassette 122 is open on its front and rear sides to allow gas vapor to flow through and react with the surfaces of the wafers 124.

The chamber 110 has a front door (not shown) through which the cassette 122 passes at the beginning of a deposition process. The cassette may be robotically loaded into the chamber 110, as is conventional with deposition equipment used in semiconductor processing. After loading of the cassette 122, the door is closed and sealed so that a partial vacuum can be pulled inside the chamber. A heater (not shown) precisely controls the temperature within the chamber 110. The walls 112, 114, 116, and 118 of the chamber provide a sealed enclosure against the outside atmosphere. A sealed fitting 126 in the ceiling wall 118 provides a connection point for a gas input line 128. Gas flowing in the line 128 enters the chamber 110 through a nozzle 130 retained in the fitting 126. The nozzle 130 defines a gas inlet to the chamber 110. A gas outlet for gas exiting the chamber 110 is provided by a sealed fitting 132, which may be in a back wall (not shown) or in the sidewall 114, where connection is made to an effluent line 134.

The deposition system 100 has a gas input line 136 for receiving $N_2$ gas from a source 140 of dry nitrogen. After the cassette 122 has been loaded into the chamber 110 and the chamber has been sealed, the chamber is purged with nitrogen. This sets the stage for the deposition process. A vacuum pump 142 pulls a partial vacuum in the chamber 110 and draws gas out of the chamber through intermediate devices, which are described below. Nitrogen flows into the chamber from the source 140 through a mass flow controller 144 and a valve 146, which are connected in series to a line 148 that is connected to the input line 128. A second mass flow controller 150 controls nitrogen flow through an alternate path during vapor deposition. Electrically driven solenoid devices (not shown) precisely operate the mass flow controllers 144 and 150. Such equipment is well known. The valve 146 and similar valves in the system 100 are pneumatically operated on/off valves.

A vaporizer 152 is used to heat powdered PFDA to a vapor. To initiate vapor deposition, valve 146 is turned off. Nitrogen gas, which serves as a carrier for the PFDA vapor, is provided to the vaporizer 152 through the mass flow controller 150 and a valve 154. PFDA vapor is carried in the nitrogen gas stream into the chamber 110 from the vaporizer 152 through a valve 156 and a step-motor driven throttle 158, which precisely controls the vapor flow rate. A second step-motor driven throttle 160 connected to the effluent line 134 cooperates with the first throttle 158 to provide uniform vapor flow through the chamber 110. Excess PFDA that does not react in the chamber flows out through effluent line 134, the throttle 160, a valve 162 and into a trap 164, where it solidifies. Nitrogen gas that is essentially free of PFDA flows out of the trap 164 through a valve 166, and then through the vacuum pump 142 to an exhaust line 168, where it leaves the system 100. Pure nitrogen from the source 140 is also supplied to the trap 164 through a valve 170. During cleaning and maintenance, the chamber 110 can be isolated from the vaporizer 152 by turning off the valve 156. The vaporizer 152 can be purged through the trap 164 by opening a connecting valve 172 and passing nitrogen through the vaporizer and the trap.

Despite precise control of the PFDA vapor flow rate through the chamber 110, the system 110 did not provide uniform PFDA deposition on the DMD surfaces of the wafers 124. It was found that small particles of PFDA tended to form in the gas lines as the vapor flowed from the vaporizer 152 to the chamber 110. Such particles would deposit on the mirror surfaces resulting in defective DMD chips. The invention addresses this problem.

SUMMARY OF THE INVENTION

A principal object of the invention is to provide a system for the simultaneous filtering and multi-directional injection of reactant vapors into a deposition chamber.

A further object of the invention is the provision of a filter-diffuser device connected to a vapor inlet within a vacuum chamber to remove particulate matter while injecting vapor containing a passivant into the chamber in a uniform manner.

A further object of the invention is the formation of an ultra-thin passivation layer on the surfaces of a micromechanical device to substantially reduce stiction forces.

A further object of the invention is the provision of multiple porous metal filters interconnected near a vapor inlet to a deposition chamber to enable formation of a uniform monolayer of PFDA on the surfaces of digital micromirror devices disposed within the chamber.

The novel features that characterize the invention are set forth in the appended claims. The nature of the invention, however, as well as its advantages, may be understood more fully upon consideration of the following illustrative embodiments, when read in conjunction with the accompanying drawings.

DETAILED DESCRIPTION OF THE INVENTION

Figure 5:
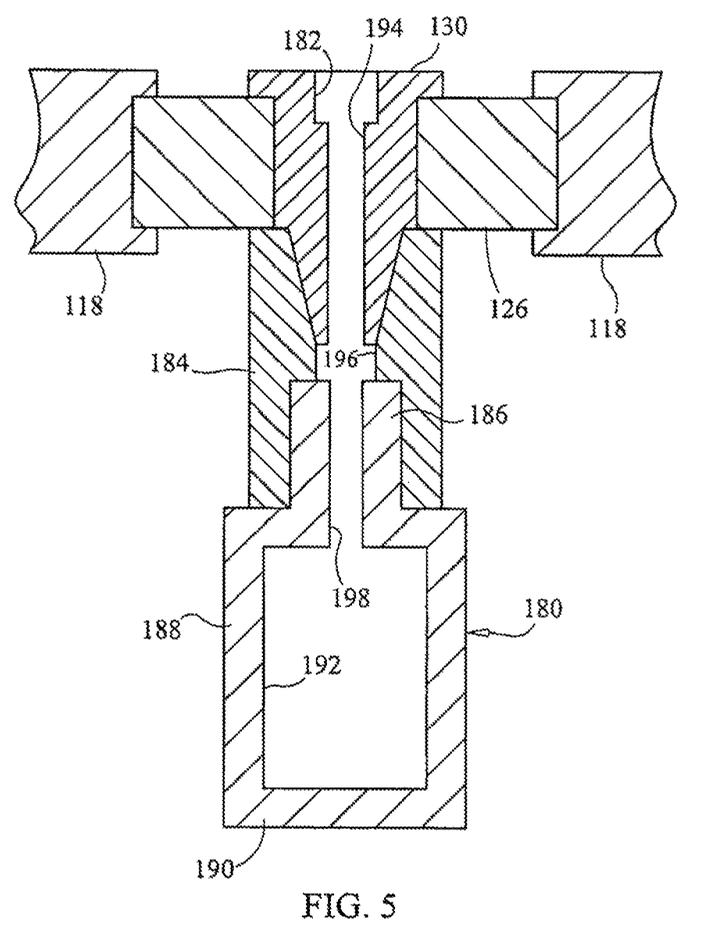
FIG. 5 is a schematic vertical cross-section through an experimental filter and connected components for introducing vapor into a chamber, a wall of which is shown broken away.

With reference to FIG. 5, an experimental filter 180 is shown connected beneath the ceiling wall 118 of the previously described vapor deposition chamber 110. The fitting 126 is shown secured in seal-forming relationship in the ceiling wall 118, and the nozzle 130 is shown secured in seal-forming relationship in the fitting 126. Gas-tight seals can be provided by using conventional o-rings (not shown) or by welding. A threaded opening 182 is provided in the nozzle 130 to enable connection to the gas input line 128 (shown in FIG. 4). FIG. 5 also shows a coupling 184 making a tapered threaded connection to the bottom of the nozzle 130. The lower end of the coupling makes a standard threaded connection to a narrow neck portion 186 of the filter 180. The filter 180 has a cylindrical sidewall 188 and a circular bottom wall 190 that define an interior cavity 192. Cylindrical passageways 194, 196, and 198 in the nozzle 130, coupling 184, and filter neck portion 186 provide fluid communication for gas flow from the opening 182 in the nozzle 130 down into the cavity 192.

The preferred material for the filter 180 is porous metal with submicron pores suitable for trapping microscopic PFDA particles while allowing individual PFDA molecules to flow through into the interior of the vapor deposition chamber. Most preferably, the filter is formed from stainless steel particles that that are compacted into a mold and then sintered into a porous solid in the shape of the mold. U.S. Pat. No. 3,933,652 describes a technique of making such porous stainless steel filters.

Although the experimental filter 180 successfully removed PFDA particles from the vapor entering the chamber 110, the uniformity of the PFDA deposition on the DMD chips was poor. This was attributed to a restricted flow rate of PFDA vapor into the deposition chamber 110 through the filter 180. An alternative filter arrangement solved this problem and provided additional benefits, as well now be described.

Figure 8:
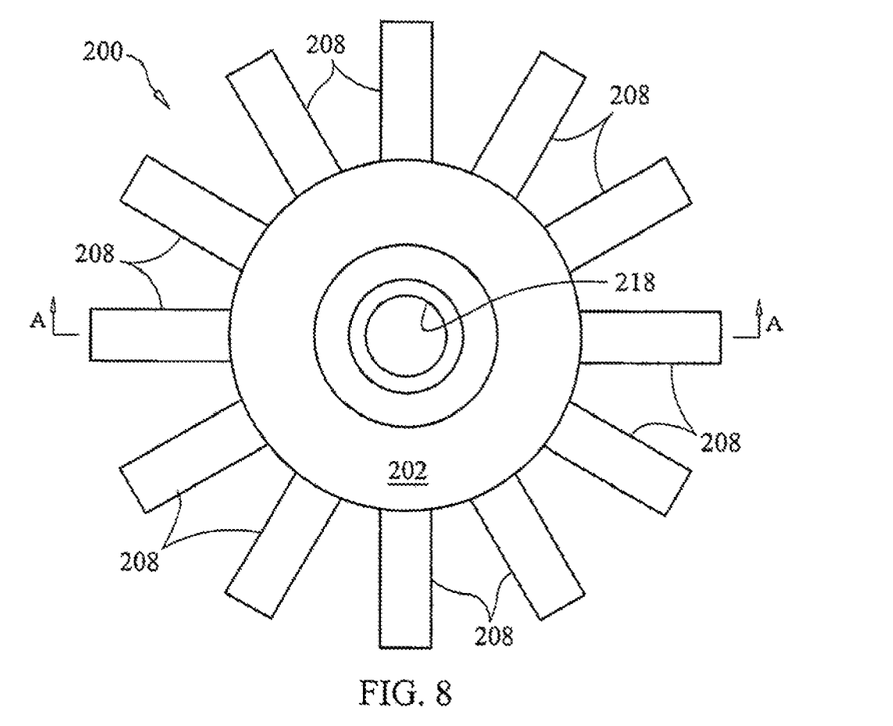
FIG. 8 is a plan view of a filter-diffuser according to the present invention.
Figure 9:
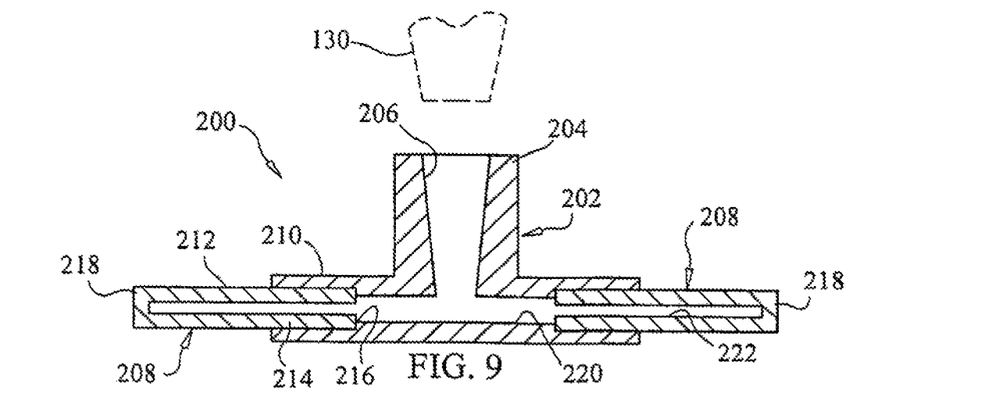
FIG. 9 is a center cross-section of the filter-diffuser of FIG. 8 taken through line A-A of FIG. 8, the cross-sectional view of the filter-diffuser being shown juxtaposed with a broken-away portion of a nozzle, shown in phantom outline, to which the filter-diffuser is connected in a deposition system.
Figure 10:
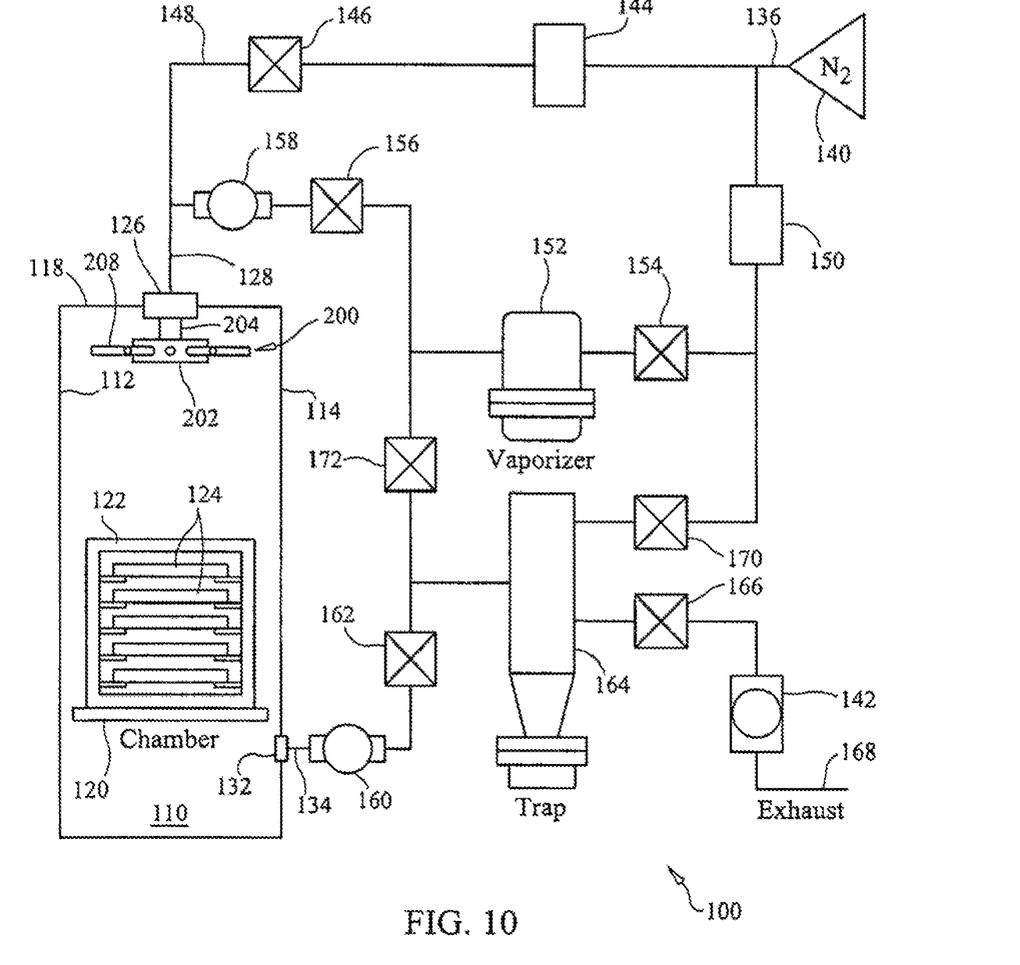
FIG. 10 is a block diagram, similar to FIG. 4, showing the component parts of a vapor deposition system in which a filter-diffuser constructed according to the present invention is interconnected.

In accordance with the invention, referring to FIGS. 8 and 9, a filter-diffuser is designated generally by reference numeral 200. The filter-diffuser 200 includes a manifold 202 that has an axially oriented throat 204, which includes a tapered threaded interior wall 206. The interior wall 206 mates with the complementary end of the previously described nozzle 130, the mating end of which is shown in phantom outline. Porous metal filters 208, preferably eight in number as shown in FIG. 8, are arranged symmetrically in daisy-wheel fashion around the periphery of the manifold 202. Preferably, the filters are porous stainless steel filters with submicron pores that readily pass individual PFDA molecules but filter out larger PFDA particles. Suitable filters of this type can be purchased from Mott Corporation of Farmington, Conn.

The manifold 202 has a wide cylindrical body portion 210 extending radially outward from the narrower throat portion 204. The filters 208 have elongated cylindrical walls 212 terminating in threaded ends 214 that screw into threaded sockets 216 at the periphery of the manifold body 210. The free end of each filter 208 terminates in a closed circular wall 218. The manifold 202 has an interior cavity 220, which is open at the upper end of the throat 204 where it receives gas inflow from the nozzle 130. Each filter 208 has a cylindrical cavity 222, which is open at its inner end and in fluid communication with the manifold cavity 220.

It will be appreciated that the filter-diffuser 200 can be used in place of the combination of the filter 180 and coupling 184 shown in FIG. 5. When installed in the chamber 110 of FIG. 4, an improved vapor deposition system is achieved. Even though the individual filters 208 in the preferred embodiment may be smaller in diameter than the experimental filter 180, the effective surface area of all eight filters 208 combined greatly increases the gas flow-through volume by comparison to the single filter 180. Additionally, the daisy-wheel arrangement of the filters 208 causes gas vapor to be injected into the chamber 110 in highly diffused manner, which results in a more uniform distribution of the PFDA molecules in the vapor, and consequently greater success in depositing a uniform monolayer on the exposed aluminum surfaces of the wafers being processed.

It is believed that the multi-directional flow of vapor through the walls of the filters 208 effectively agitates the vapor within the chamber to deliver PFDA molecules to the surfaces of the wafer in a continuous and uniform manner. Through experience, the deposition process is terminated after a predetermined time upon completion of the monolayer formation and to prevent over reaction. Five minutes has been found to achieve the desired results.

Although preferred embodiments of the invention have been described in detail, it will be understood that various changes, substitutions, and alterations can be made therein without departing from the spirit and scope of the invention as defined by the appended claims.

What is claimed is:

1. A method of passivating the surfaces of a micromechanical device, the method comprising:
    providing a micromechanical device within a sealed chamber;
    pulling a partial vacuum in the chamber;
    introducing a vapor consisting of passivants to an inlet to the chamber having a filter-diffuser located thereat, the passivants include perfluordecanoic acid (PFDA);
    simultaneously, at the filter-diffuser, filtering the vapor arriving at the inlet and injecting the vapor in multiple directions to uniformly distribute the vapor within the chamber, the vapor being injected through a manifold having a cylindrical body portion coupled to a central cylindrical cavity, wherein filters are attached to the periphery thereof and extend radially outward from the body portion;
    flowing the vapor from the manifold to the central cylindrical cavity and radially outward through the filters and into the chamber;
    filtering the vapor at the inlet such that pores in the filter walls allow individual PFDA molecules to flow through the filter walls but that filter out larger PFDA particles; and
    allowing the vapor to react with the surfaces of the micromechanical device for a predetermined time.

2. The method as recited in claim 1, further comprising reacting the passivant with the surfaces of the micromechanical device to provide an ultra-thin, anti-stiction layer on the surfaces.

3. The method as recited in claim 1, further comprising symmetrically arranging multiple cylindrical filter walls in daisy-wheel fashion around the periphery of the manifold near the chamber inlet.

4. The method as recited in claim 1, further comprising selecting each filter having filter walls formed of a porous metal to include stainless steel.

5. The method as recited in claim 1, further comprising providing filter walls for each filter that include a cylindrical sidewall terminating in an end wall that cooperate to define a cylindrical cavity within the filter, the manifold having an interior cavity in fluid communication with each filter cavity to provide vapor from the inlet to the filter cavities.

6. The method as recited in claim 1, further comprising providing filters having elongated cylindrical walls terminating in threaded ends.

7. The method as recited in claim 6, wherein the threaded ends of the filters screw into threaded sockets at the periphery of the cylindrical body of the manifold.

8. The method as recited in claim 1, wherein providing a micromechanical device within a sealed chamber further comprises providing at least one wafer containing a plurality of chips within a sealed chamber.

9. The method as recited in claim 1, wherein providing a micromechanical device within a sealed chamber further comprises providing a plurality of separated chips within a sealed chamber.

10. A method of passivating the surfaces of a micromechanical device, the method comprising:
 providing a micromechanical device within a sealed chamber;
 pulling a partial vacuum in the chamber;
 introducing a vapor containing passivants to an inlet to the chamber;
 simultaneously filtering the vapor arriving at the inlet and injecting the vapor in multiple directions to uniformly distribute the vapor within the chamber, the vapor being injected through a manifold having a cylindrical body portion coupled to a central cylindrical cavity, wherein filters are attached to the periphery thereof and extend radially outward from the body portion;
 flowing the vapor from the manifold to the central cylindrical cavity and radially outward through the filters and into the chamber;
 filtering the vapor at the inlet such that pores in the filter walls allow individual passivant molecules to flow through the filter walls but that filter out larger passivant particles; and
 allowing the vapor to react with the surfaces of the micromechanical device for a predetermined time.

11. The method as recited in claim 10, wherein providing a micromechanical device within a sealed chamber further comprises providing at least one wafer containing a plurality of chips within a sealed chamber.

12. The method as recited in claim 10, wherein providing a micromechanical device within a sealed chamber further comprises providing a plurality of separated chips within a sealed chamber.

13. The method as recited in claim 10, further comprising reacting the passivant with the surfaces of the micromechanical device to provide an ultra-thin, anti-stiction layer on the surfaces.

14. The method as recited in claim 10, further comprising symmetrically arranging multiple cylindrical filter walls in daisy-wheel fashion around the periphery of the manifold near the chamber inlet.

15. The method as recited in claim 10, further comprising selecting each filter having filter walls formed of a porous metal to include stainless steel.

16. The method as recited in claim 10, further comprising providing filter walls for each filter that include a cylindrical sidewall terminating in an end wall that cooperate to define a cylindrical cavity within the filter, the manifold having an interior cavity in fluid communication with each filter cavity to provide vapor from the inlet to the filter cavities.

17. The method as recited in claim 10, further comprising providing filters having elongated cylindrical walls terminating in threaded ends.

18. The method as recited in claim 10, wherein the threaded ends of the filters screw into threaded sockets at the periphery of the cylindrical body of the manifold.

19. A method of passivating the surfaces of a micromechanical device, the method comprising:
 providing a micromechanical device within a sealed chamber;
 pulling a partial vacuum in the chamber having a filter-diffuser located thereat;
 introducing a vapor consisting of passivants to an inlet to the chamber, the vapor being injected through a manifold having a cylindrical body portion coupled to a central cylindrical cavity, wherein filters are attached to the periphery thereof and extend radially outward from the body portion;
 flowing the vapor from the manifold to the central cylindrical cavity and radially outward through the filters and into the chamber;
 filtering the vapor at the filter-diffuser at the inlet such that pores in the filter walls of the filter-diffuser allow individual passivant molecules to flow through the filter walls but that filter out larger passivant particles; and
 allowing the vapor to react with the surfaces of the micromechanical device for a predetermined time.

20. The method as recited in claim 19, wherein providing a micromechanical device within a sealed chamber further comprises providing at least one wafer containing a plurality of chips within a sealed chamber.

21. The method as recited in claim 19, wherein providing a micromechanical device within a sealed chamber further comprises providing a plurality of separated chips within a sealed chamber.

* * * * *